(12) United States Patent
Gopinath et al.

(10) Patent No.: US 9,305,643 B2
(45) Date of Patent: Apr. 5, 2016

(54) SOLID ELECTROLYTE BASED MEMORY DEVICES AND METHODS HAVING ADAPTABLE READ THRESHOLD LEVELS

(71) Applicant: Adesto Technologies Corporation, Sunnyvale, CA (US)

(72) Inventors: Venkatesh P. Gopinath, Fremont, CA (US); Foroozan Sarah Koushan, San Jose, CA (US); Derric Jawaher Herman Lewis, Sunnyvale, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 55 days.

(21) Appl. No.: 13/851,011

(22) Filed: Mar. 26, 2013

(65) Prior Publication Data
US 2013/0258753 A1   Oct. 3, 2013

Related U.S. Application Data

(60) Provisional application No. 61/616,064, filed on Mar. 27, 2012.

(51) Int. Cl.
G11C 13/00     (2006.01)
G11C 11/56     (2006.01)
G11C 16/28     (2006.01)

(52) U.S. Cl.
CPC .......... *G11C 13/004* (2013.01); *G11C 11/5614* (2013.01); *G11C 13/0011* (2013.01); *G11C 13/0035* (2013.01); *G11C 13/0064* (2013.01); *G11C 13/0069* (2013.01); *G11C 16/28* (2013.01)

(58) Field of Classification Search
CPC ........... G11C 13/0011; G11C 11/5614; G11C 2013/009; G11C 13/0097; G11C 13/0033; G11C 13/0069; G11C 16/3431; G11C 16/28; G11C 29/42; G11C 29/026; G11C 29/028; G11C 29/02; G11C 16/10; G11C 11/5628
USPC .............. 365/45, 100, 140, 148, 163, 185.03, 365/185.17, 185.18; 711/102, 106
See application file for complete search history.

(56) References Cited

U.S. PATENT DOCUMENTS

| | | | |
|---|---|---|---|
| 5,761,115 A | 6/1998 | Kozicki et al. | |
| 6,487,106 B1 | 11/2002 | Kozicki | |
| 6,635,914 B2 | 10/2003 | Kozicki et al. | |
| 6,825,489 B2 | 11/2004 | Kozicki | |
| 6,865,117 B2 | 3/2005 | Kozicki | |
| 6,927,411 B2 | 8/2005 | Kozicki | |
| 7,016,234 B2 | 3/2006 | Ishida et al. | |
| 7,101,728 B2 | 9/2006 | Kozicki et al. | |
| 7,106,614 B2 | 9/2006 | Symanczyk | |

(Continued)

OTHER PUBLICATIONS

PCT International Search Report for International Application No. PCT/US2013/034015, dated Jul. 3, 2013.

(Continued)

*Primary Examiner* — Richard Elms
*Assistant Examiner* — Ajay Ojha

(57) ABSTRACT

A method can include determining at least one use characteristic for the memory cells comprising a solid electrolyte, the use characteristic corresponding to a number of times the memory cells have been programmed to at least one impedance level; and adjusting a read threshold level for the memory cells based on at least the use characteristic, the read threshold level determining data values stored in the memory cells in a read operation.

20 Claims, 11 Drawing Sheets

(56) References Cited

U.S. PATENT DOCUMENTS

| | | |
|---|---|---|
| 7,167,390 B2 | 1/2007 | Ishida et al. |
| 7,209,379 B2 | 4/2007 | Mori et al. |
| 7,239,542 B2 | 7/2007 | Ootsuka et al. |
| 7,254,052 B2 | 8/2007 | Liaw |
| 7,337,282 B2 | 2/2008 | Happ et al. |
| 7,359,236 B2 | 4/2008 | Gilbert |
| 7,402,847 B2 | 7/2008 | Kozicki et al. |
| 7,426,131 B2 | 9/2008 | Gilbert |
| 7,428,163 B2 | 9/2008 | Hoenigschmid et al. |
| 7,457,145 B2 | 11/2008 | Kund et al. |
| 7,471,543 B2 | 12/2008 | Nakashima et al. |
| 7,483,294 B2 | 1/2009 | Gilbert |
| 7,495,971 B2 | 2/2009 | Egerer |
| 7,514,706 B2 | 4/2009 | Gilbert |
| 7,539,050 B2 | 5/2009 | Philipp et al. |
| 7,583,525 B2 | 9/2009 | Shiimoto et al. |
| 7,715,220 B2 | 5/2010 | Tsushima et al. |
| 7,916,524 B2 | 3/2011 | Happ et al. |
| 8,107,273 B1 | 1/2012 | Hollmer et al. |
| 8,274,842 B1 | 9/2012 | Hollmer et al. |
| 8,294,488 B1 | 10/2012 | Derhacobian et al. |
| 8,331,128 B1 | 12/2012 | Derhacobian et al. |
| 2006/0265548 A1* | 11/2006 | Symanczyk et al. ........... 711/106 |
| 2007/0053224 A1* | 3/2007 | Happ et al. ............... 365/185.17 |
| 2008/0043521 A1* | 2/2008 | Liaw et al. ..................... 365/163 |
| 2009/0003037 A1* | 1/2009 | Symanczyk .................. 365/148 |
| 2009/0103350 A1 | 4/2009 | Kund |
| 2010/0091535 A1* | 4/2010 | Sommer et al. .................. 365/45 |
| 2010/0195370 A1 | 8/2010 | Shiimoto et al. |
| 2010/0214818 A1 | 8/2010 | Kitagawa et al. |
| 2012/0063231 A1* | 3/2012 | Wood et al. .............. 365/185.18 |

OTHER PUBLICATIONS

PCT Written Opinion of the International Search Authority for International Application No. PCT/US2013/034015, dated Jul. 3, 2013.

* cited by examiner (BOR)

(MOR)

(EOR)

SOLID ELECTROLYTE BASED MEMORY DEVICES AND METHODS HAVING ADAPTABLE READ THRESHOLD LEVELS

This application claims the benefit of U.S. provisional patent application Ser. No. 61/616,064, filed on Mar. 27, 2012, the contents of which are incorporated by reference herein.

TECHNICAL FIELD

The present disclosure relates generally to memory devices having elements programmable to different impedance states, and more particularly to devices and methods that can adapt to changes in the impedance states of such elements.

BACKGROUND

Conventional conductive bridging random access memories (CBRAM) can include memory elements that can be programmed between a high resistance state and a low resistance state by forming conductive paths through a solid electrolyte.

A drawback to conventional CBRAM devices can be the tendency of memory cell resistance value distributions to increase over time. More particularly, erased CBRAM elements subject to few erase operations can have a tighter resistance distribution than erased CBRAM elements that have been subject to a large number of erase operations.

DETAILED DESCRIPTION

Figure 1:
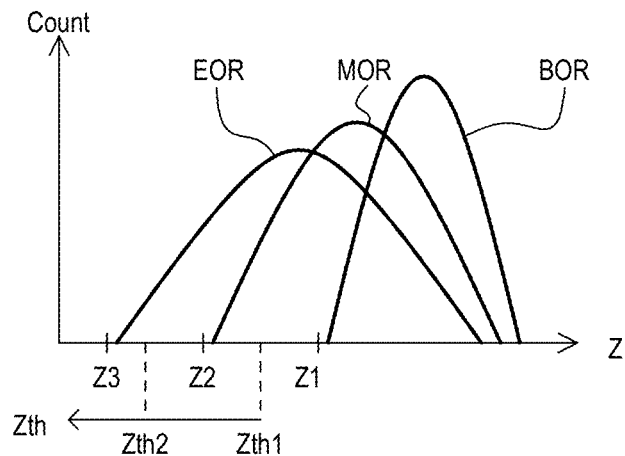
FIG. 1 is a graph showing a read threshold adjustment operation according to one embodiment.

Embodiments described herein show memory devices, circuits and methods, in which a read threshold level (e.g., a level used to determine stored data values within programmable impedance memory cells) can be adjusted according to use characteristics of such memory cells. Use characteristics can track changes in the impedance distribution of memory cells as they used in various applications (e.g., cycled through programming operations, read operations, temperature changes, passage of time, etc.).

In some embodiments, once memory cells are determined to have too large an impedance distribution, the memory cells can be subject to a "re-conditioning" step, which can tighten the distribution. The read threshold level can then be adjusted (or reset) to reflect the tighter distribution.

It is noted that the term "programming" as used herein can include any electrical conditions used to establish a data value in a memory cell. Accordingly, erase operations that place memory cells in one impedance state (e.g., conductive bridging random access memory "CBRAM" cells erased to a high resistance state) are understood to be one type of programming operation.

In the embodiments below, like items are referred to by the same reference character but with the first digit(s) corresponding to the figure number.

FIG. 1 is a graph showing a read threshold adjustment operation according to one embodiment. FIG. 1 shows distributions for memory cells that store data values according to their impedance (e.g., resistance, capacitance). A data value can be sensed in a read operation by comparing a memory cell impedance to a read threshold (Zth).

FIG. 1 shows three memory cell impedance distributions. Curve BOR shows a "beginning of rotation" distribution. Curve MOR shows a "middle of rotation" distribution. Curve EOR shows an "end of rotation" distribution.

In some embodiments, a rotation can represent the programming of memory cells multiple times prior to a re-conditioning operation. That is, when first used, memory cells can be at the beginning of a rotation. As the memory cells are subject to programming operations, they can progress through a middle of rotation and to an end of rotation. However, after a re-conditioning operation, the memory cells may once again be at a beginning of a rotation.

In other embodiments, where re-conditioning is not employed, a rotation can be the expected lifetime of the memory cells.

As shown, as the rotation of the memory cells progresses, a resulting impedance distribution can grow wider. However, according to the embodiments, read operations can adapt to such a change in distribution by adjusting a read threshold (Zth). Accordingly, in the particular embodiment shown, at the beginning of the rotation (BOR), a distribution can fall within limit Z1. Accordingly, a read threshold Rth can have a value Zth1 (giving some margin with respect to the distribution).

However, once it is determined that a "tail" (i.e., the leftmost portion) of the distribution is approaching (or passing) a limit Z1, a memory device can adapt, changing the read threshold to Zth2, accommodating the wider distribution in impedance values.

In some embodiments, once it is determined that a distribution tail is approaching a final limit (e.g., Z3), a re-condition operation can take place, returning the memory cells to a tighter impedance distribution (e.g., tighter than EOR).

It is understood that read threshold values (Zth1, Zth2) can be realized as reference currents, reference voltages, reference capacitances, etc.

It is also understood that horizontal axis Z may represent an increasing impedance in some embodiments, and can be a decreasing impedance in other embodiments.

Figure 2:
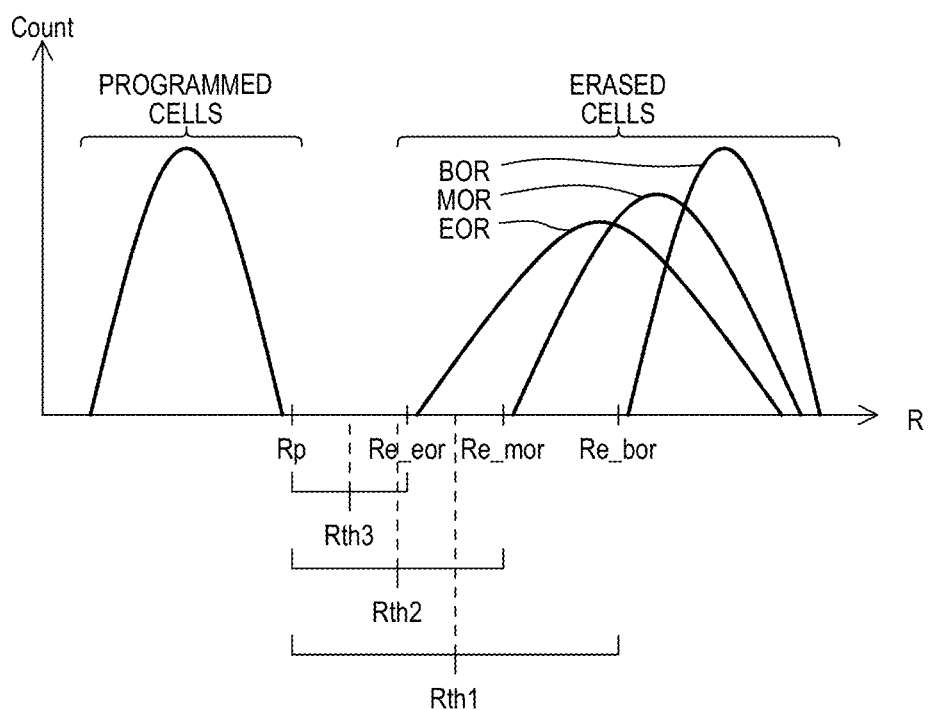
FIG. 2 is a graph showing distributions and thresholds for memory cells that can be programmed to a lower resistance state and erased to a higher resistance state, according to an embodiment.

FIG. 2 is a graph showing distributions for memory cells that can be programmed to a lower resistance state and erased to a higher resistance state. In a particular embodiment, FIG. 2 can show operations for CBRAM type memory cells. CBRAM type memory cells can include one or more solid electrolyte layers programmable between different resistance values by application of electric fields. In some embodiments, such a solid electrolyte can include a chalcogenide, metal oxide, non-metal oxide, or combinations thereof. In particular embodiments, a solid electrolyte can include conductive ions that can form and dissolve conductive regions in the solid electrolyte.

FIG. 2 shows distributions of erased memory cells for various stages (BOR, MOR, EOR) as in FIG. 1. However, FIG. 2 also shows a distribution for programmed cells. As shown, programmed cells can have resistances that are less than Rp. At the same time, erased memory cells can have lower resistance limits that decrease as the memory cells' rotation progresses. Thus, at a beginning of rotation, memory cells can have resistances greater than Re_bor. In the middle of a rotation, memory cell resistances can be greater than Re_mor (where Re_bor>Re_mor), etc.

As shown, read thresholds (Rth1, Rth2, Rth3) can be varied to ensure sufficient margin exists between the programmed cell resistance limit (Rp) and the varying erase resistance limits (Re_bor, Re_mor, Re_eor). That is, at a beginning of rotation, a read threshold can be Rth1, maximizing a sensing margin (e.g., the difference between the read threshold and the resistance limits). As the memory device continues to operation, progressing through a rotation, a read threshold can be adjusted to continue to maximize a sensing margin for the giving program and erase resistance limits. FIG. 2 shows two more read thresholds (Rth2, Rth3) but it is understood that other embodiments can include as few as two read thresholds, or more than three read thresholds.

It is understood that according to embodiments, a read threshold can be adjusted for optimizing a read operation, which may not always include maximizing a sense margin. That is, while a read threshold can adapt to the use characteristics of the memory cells, such an adaptation can be according to other criteria that do not result in a read threshold level midway between limits.

Figure 3:
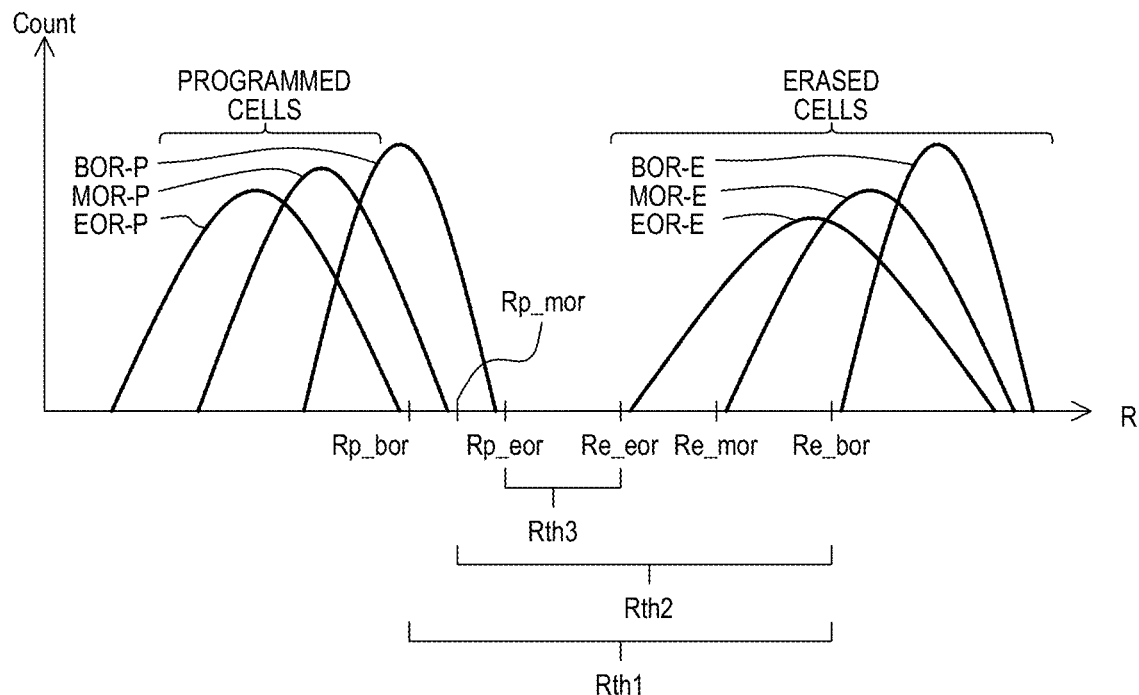
FIG. 3 is a graph showing distributions and thresholds for memory cells like that of FIG. 2, but with variable program and erase distributions.

FIG. 3 is a graph showing distributions for memory cells like that of FIG. 2. However, unlike FIG. 2, both programmed and erased cells can have distributions that vary as they are subject to programming operations. Thus, three curves are shown for erased cells (BOR-E, MOR-E, EOR-E) and three curves are shown for programmed cells (BOR-P, MOR-P, EOR-P).

It is noted that in some embodiments, the manner in which memory cells are programmed between different states can vary. As but one example, in some embodiments, memory cells can be erased to high resistance states in a group, and programmed to a low resistance state individually. In such embodiments, program resistance limits (Rp_bor, Rp_mor, Rp_eor) may not be distribution limits, but rather "worst" case values. That is, for the group of memory cells, some memory cells may have been programmed to a lower resistance more times than others. Program resistance limits can correspond to resistance changes expected for memory cells programmed a highest (or higher) number of times. In addition or alternatively, such "worst" case programmed limits can be measured values (a memory cell, or memory cells that take the longest time to program, or the most times to verify as programmed).

In this way, a read threshold can be adjusted according to multiple use characteristics for a group of memory cells. As noted in embodiments above, read threshold adjustments need not fall midway between impedance limits.

Figure 4:
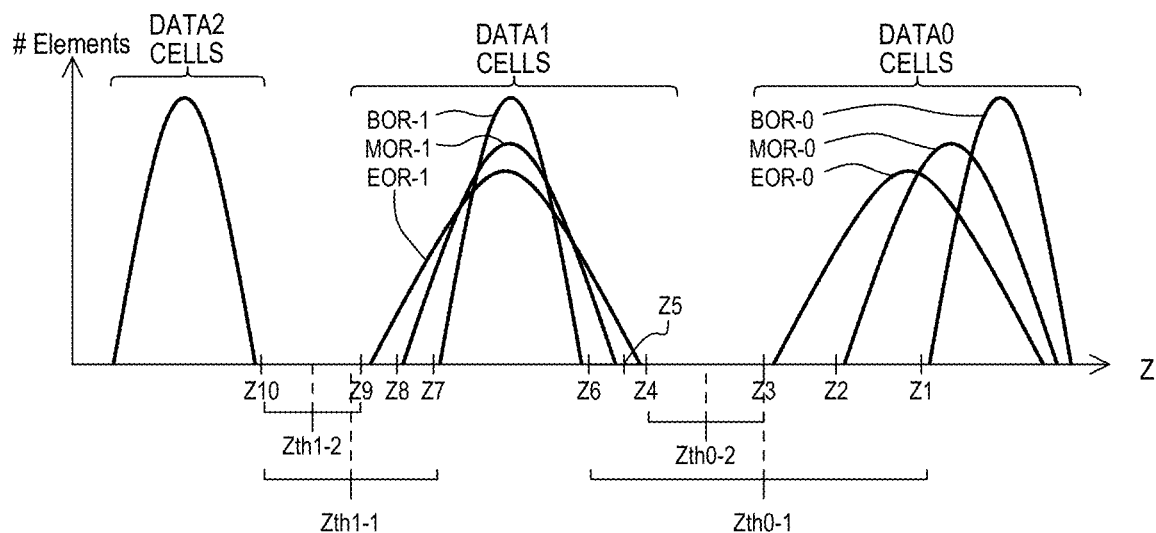
FIG. 4 is a graph showing distributions and thresholds for memory cells that can be programmed between more than two impedance states, according to an embodiment.

FIG. 4 is a graph showing distributions for memory cells that can be programmed between more than two impedance states. In such embodiments, there can be multiple read thresholds that are adjusted in response to use characteristics of the memory cells.

In the embodiment of FIG. 4, memory cells can be programmed between three states (DATA0, DATA1, DATA2). FIG. 4 shows a first set of read thresholds Zth0-1 and Zth1-1 corresponding to all memory cells being at a beginning of rotation. A second set of read thresholds Zth0-2 and Zth1-2 can correspond to memory cells being at an end of rotation.

Alternate embodiments for memory cells having more than three impedance states are understood from FIG. 4.

Figure 5:
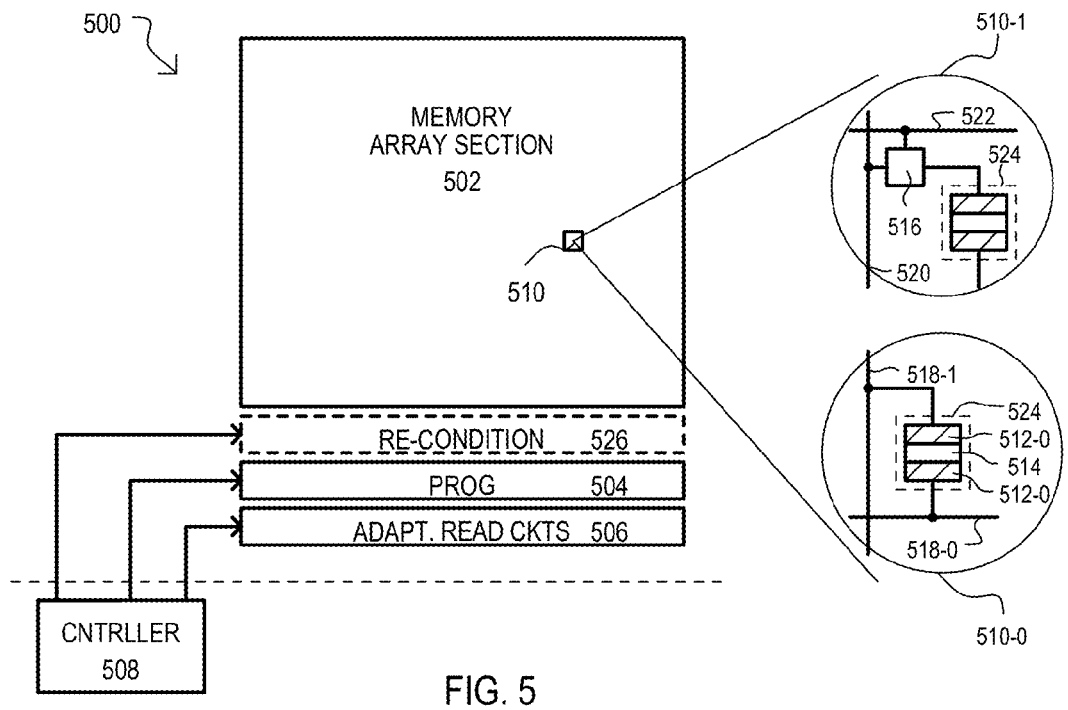
FIG. 5 is a block schematic diagram of a memory device according to an embodiment.

FIG. 5 is a block schematic diagram of a memory device 500 according to an embodiment. A memory device 500 can include a memory array section 502, program circuits 504, adaptive read circuits 506, and a controller circuit 508. A memory array section 502 can include a number of memory cells (one shown as 510), each of which can include one or more elements formed with a solid electrolyte layer. A memory array section 502 can include decoder circuits for connecting selected memory cells to program circuits 504 and/or adaptive read circuits 506 in response to address data.

FIG. 5 also shows two very particular examples of memory cells that can be included in the embodiments. Memory cell 510-0 can be a "cross point" array type memory cell, with a memory element 524 connected between conductive lines 518-0/1. Memory cells of a same row can be connected to one conductive line 518-0, while memory cells of a same column are connected to the other conductive line 518-1. A memory element 524 can include a solid electrolyte. In the very particular embodiment shown, a memory element 524 can include a memory layer 514 composed, at least in part, of a solid electrolyte layer. Memory layer 514 can be formed between two electrodes 512-0/1. A solid electrolyte can include a metal oxide, a non-metal oxide, a chalcogenide, or combinations thereof. In some embodiments, a solid electrolyte metal oxide can include a transition metal oxide, and in particular embodiments, a rare-earth oxide.

Memory cell 510-1 can include one access device 516 and one memory element 524 like that described above (e.g., a 1T-1R cell). An access device 516 can include any suitable device, such as a transistor. In response to a signal on a word line 522, access device 516 can provide a low impedance path between element 524 and a bit line 520. Memory cells of a same row can be connected to a same word line 522, while memory cells of a same column can be connected to the same bit line 520.

While FIG. 5 shows memory cells 510-0/1 having particular structures, alternate embodiments can include different types of memory cells, including but not limited to static random access memory (SRAM) type cells (i.e., 4-T SRAM cells with memory elements as pull-up or pull-down devices) or memory cells with more than one element in series or in parallel with one another, as but a few examples.

Memory array section 502 can also be divided into regions (e.g., sectors, pages) that are separately accessible according to address or other selection criteria.

Program circuits 504 can program memory cells between two more different impedance states by application of electrical conditions. In some embodiments, program circuits 504 can program groups of memory cells to a same impedance state in one operation. As but one example, in some CBRAM embodiments, program circuits 504 can erase all memory cells of a group to a high resistance state. In response to write data, program circuits 504 can then selectively program some memory cells to a low resistance state.

Adaptive read circuits 506 can read data values from memory cells based on one or more read threshold values, where such read threshold values can be altered based on use characteristics of the memory cells. Adaptive read circuits 506 can change a read threshold value as shown in the various embodiments herein, and equivalents.

In the particular embodiment shown, a controller circuit 508 can determine a use characteristic of memory cells within memory array section 502. In some embodiments, a use characteristic can be determined based on actual measurements of memory cell performance. However, in other embodiments, use characteristics can be based on a history of memory cell use (e.g., program cycles). From a determined use characteristic, a controller circuit 508 can generate reference values for use by adaptive read circuits 506 that can change the read threshold value used by the read circuits 506 to distinguish data values stored by memory cells of memory array section 502.

In some embodiments, a controller circuit 508 can be formed in a same integrated circuit device as the various other sections (e.g., 502, 504, 506). However, in other embodiments, a controller circuit 508 can be a integrated circuit device that is separate from that which includes memory array section 502. In some embodiments, a controller circuit 508 can be formed with logic circuits, while in other embodiments, a controller circuit 508 can include a processor that reads instructions from an instruction memory to perform various controller circuit functions described herein, and equivalents.

Optionally, a memory device 502 can include re-condition circuits 526. Re-condition circuits 526 can apply electrical conditions to memory cells that are different than standard program operations used to establish the data values stored by the memory cells. Application of re-condition electrical conditions can result in memory cells with tighter threshold distributions, as described in embodiments above. In one embodiment shown, a controller circuit 508 can activate re-condition circuits 526 in response to use characteristics reaching one or more limits, as described in the embodiments herein. In some embodiments, re-condition circuits 526 can be program circuits 504 operated to apply different electrical conditions to the memory cells than those used in data storing operations. In some embodiments, recondition circuits can apply more energy to memory cells than standard programming operations. For example, re-condition circuits 526 can apply electrical signals of a same polarity, but greater magnitude (e.g., higher voltage, higher maximum current) and/or signals of longer duration than those applied in standard programming operations. In one very particular embodiment, a standard erase operation can erase memory cells to a high resistance state by application of a negative erase voltage for a first duration. According to embodiments, re-condition circuits 526 can apply any of: a voltage more negative than the erase voltage, the same erase voltage for a longer duration than the first duration, or a less negative voltage for a longer duration than the first duration.

Figure 6:
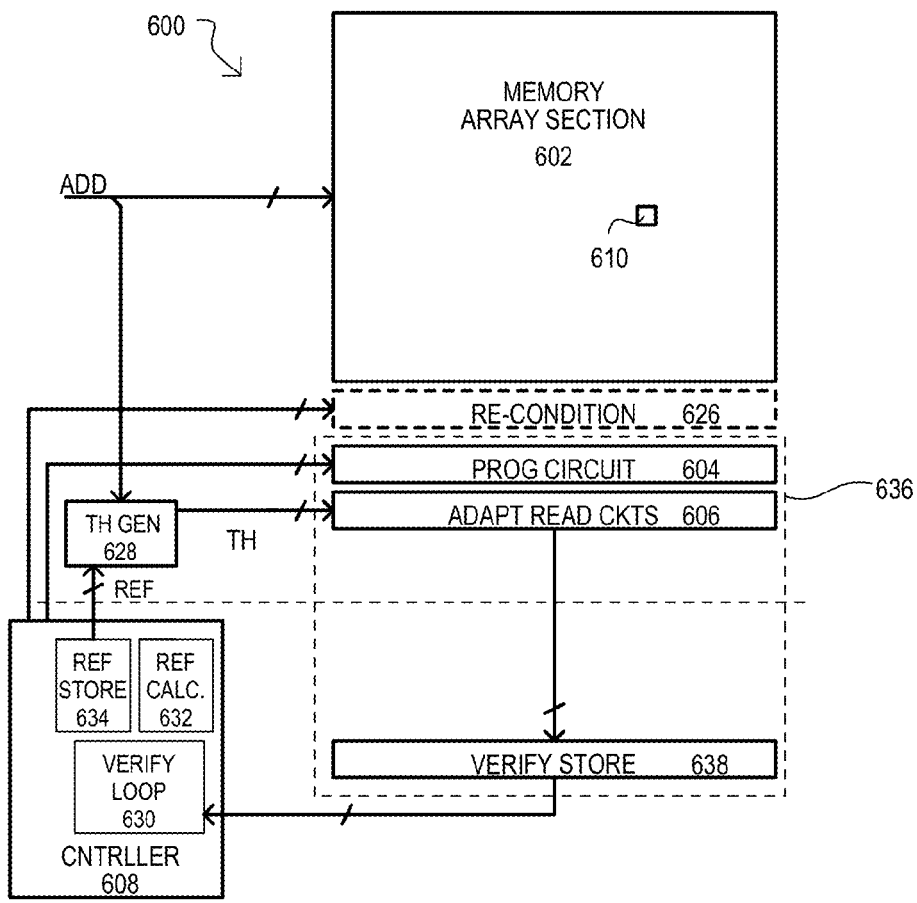
FIG. 6 is a block schematic diagram of a memory device according to another embodiment.

FIG. 6 is a block schematic diagram of a memory device 600 according to another embodiment. Memory device 600 shows one embodiment that can use a measuring technique to arrive at a use characteristic. In the particular embodiment shown, a sequence of program and verify operations can be used to determine a "tail" of a memory cell distribution.

Memory device 600 can include items like those of FIG. 5, and equivalents. In one particular embodiment, FIG. 6 can be one implementation of that shown in FIG. 5.

FIG. 6 differs from FIG. 5 in that it shows a program and verify section 636 and a threshold generator 628. Further, a controller 608 is shown to specifically include a verify loop circuit 630, a reference calculator circuit 632, and a reference store 634.

A verify section 636 can perform program and verify operations (which can include erase verify operations in a CBRAM type device). In the embodiment shown, a verify section 636 can include program circuit 604, adaptive read circuit 606, and verify store 638. In a measurement operation, a program circuit 604 can program a group of memory cells to a same impedance state. Adaptive read circuit 606 can then read data from the memory cells to verify store 638.

By operation of verify loop circuit 630, read data in verify store 638 can be read and then compared to expected values to generate verify results. Based on such verify results, a verify loop circuit 630 may conditionally repeat (i.e., loop) a verify operation (and/or a program operation). In some embodiments, conditions for subsequent verify (and/or program) operations can be different from the preceding conditions for verifying a state.

Once verify loop circuit 630 has ended program and verify operations, a reference calculator circuit 632 can generate a reference value based on results gathered by the verify loop circuit 630. As but a few of many possible examples, a reference value can be based on any of: the number of iterations in the verify loop; the number of failures in each iteration (i.e., memory cells that do not achieve a desired impedance); or combinations thereof. A generated reference value can be stored in reference store 634.

As noted above, any or all sections of a controller circuit 608 can be realized as a processor executing stored instructions.

A threshold generator 628 can generate a threshold value (TH) based on a reference value stored in reference store 634. As noted above, a threshold value can include, but is not limited to, a threshold current, voltage, or resistance. In one particular embodiment, there can be different threshold values for different portions of memory array section 602. As but one example, a memory array section 602 can include multiple sectors. In such an embodiment, there can be different threshold values for each different portion. In the embodiment of FIG. 6, a particular threshold value can be selected from threshold generator 628 by at least a portion of an address (ADD).

It is understood that a memory device 600 can generate different threshold values for different portions of a memory array section 602 by executing measurement operations on such portions separately, as described herein and equivalents.

Figure 7A:
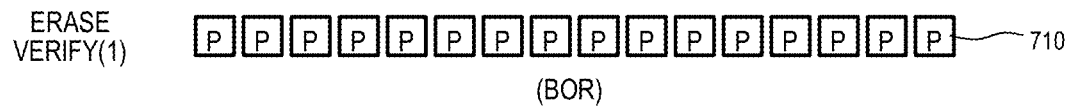
FIGS. 7A to 7C are diagrams showing a use characteristic measurement operation according to one embodiment.
Figure 7B:
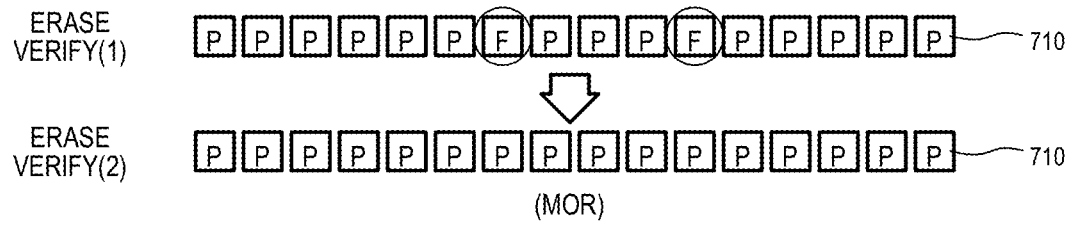
Figure 7C:
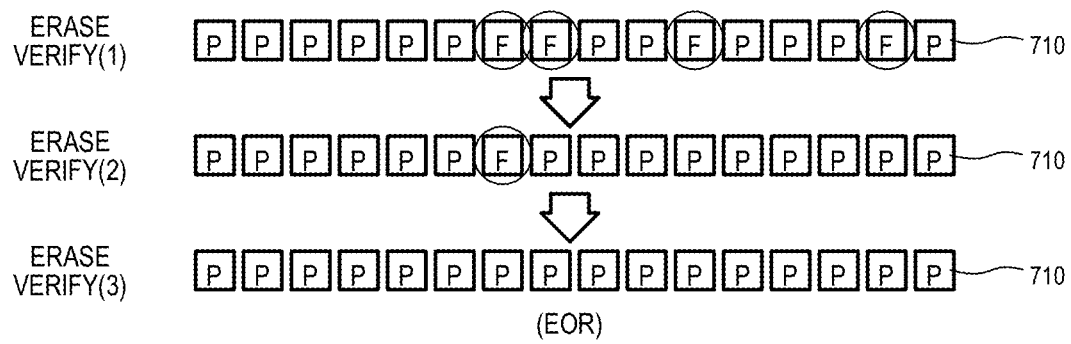

FIGS. 7A to 7C are diagrams showing a use characteristic measurement operation, using a program and verify loop, according to one very particular embodiment.

FIG. 7A shows program verify results for memory cells (one identified as 710) at a beginning of a rotation. As shown, in a first erase verify operation (ERASE VERIFY(1)), all memory cells pass (shown as P). In one embodiment, all memory cells are determined to have a resistance above some erase resistance limit.

FIG. 7B shows program verify results for a memory cells at a middle of a rotation. As shown, in a first erase verify operation (ERASE VERIFY(1)), some memory cells (in this example two), do not pass (shown as F). As a result, a verify loop can continue. In a second erase verify operation (ERASE VERIFY(2)), all memory cells pass. Such an iteration can represent a widening of the erase resistance distribution (characterized the distribution tail).

In some embodiments, a second erase verify operation may apply different programming electrical conditions than a first erase verify operation. In a very particular embodiment, a second erase verify operation may apply read thresholds of differing magnitudes. In addition or alternatively, each verify operation can include programming conditions of a greater voltage, greater current, or greater duration than that of a previous erase verify operation. However, in other embodiments, a second erase verify operation can apply the same electrical conditions as the first erase verify operation.

In response to an erase verify result like that of FIG. 7B, a controller circuit can cause a new read threshold value to be generated for read circuits of the device.

FIG. 7C shows program verify results for a memory cells at an end of a rotation. As shown, the operation has three iterations (ERASE VERIFY(1), ERASE VERIFY(2), ERASE VERIFY(3)), reflecting the widening distribution of erase resistance value.

In response to an erase verify result like that of FIG. 7C, a controller circuit can cause a new read threshold value to be generated for read circuits of the device. Alternatively, such an erase verify result can cause a controller circuit to implement a re-condition operation. Read threshold values can then be set corresponding to a new, tighter erase resistance distribution resulting from such a re-condition operation.

Figure 8:
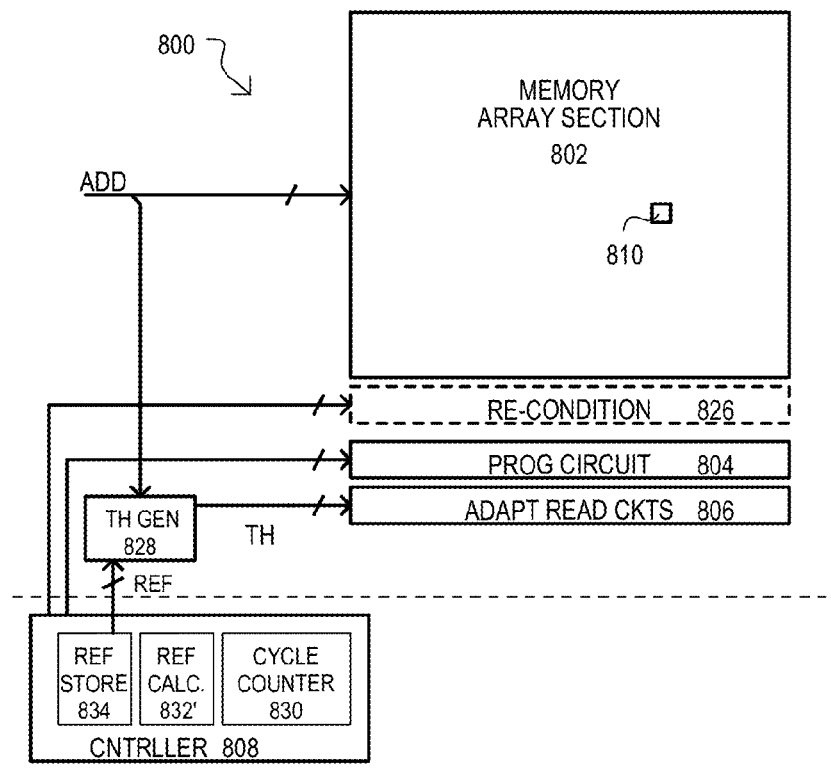
FIG. 8 is a block schematic diagram of a memory device according to a further embodiment.

FIG. 8 is a block schematic diagram of a memory device 800 according to a further embodiment. Memory device 800 shows one embodiment that utilizes an operational history as a use characteristic. In the particular embodiment shown, a memory device 800 can maintain a cycle count that represents how many times memory cells of a group have been subject to a particular program operation (e.g., how many times CBRAM elements have been erased, or how many times particular CBRAM elements have been programmed). In such an embodiment, memory cells may have been previously characterized so that impedance distributions corresponding to cycle number are understood.

Memory device 800 can include items like those of FIG. 6, and equivalents. In one particular embodiment, FIG. 6 can be one implementation of that shown in FIG. 5.

FIG. 8 differs from FIG. 6 in that it does not show a program and verify section, and a controller 808 is shown to specifically include a cycle counter 830. As program circuits 804 are activated to program memory cells to specific impedance state, a cycle counter 830 can track each such operation. It is understood that in some embodiments, a cycle counter 830 may track only one type of programming operation (e.g., in CBRAM device, a cycle counter may track erase operations but not program operations). However, in other embodiments a cycle counter 830 can track multiple program operations of different types.

A reference calculator circuit 832' can generate a reference value based on a cycle count value provided by cycle counter 830. A generated reference value can be stored in reference store 834.

As noted above, any or all sections of a controller circuit 808 can be realized as a processor executing stored instructions.

Figure 9:
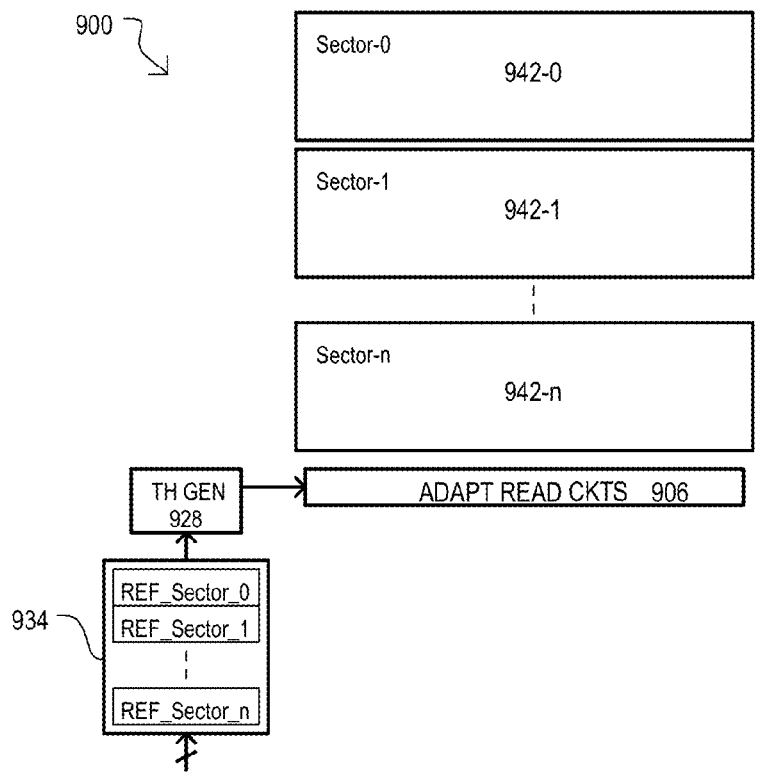
FIG. 9 is a block schematic diagram showing a memory device according to another embodiment.

FIG. 9 is a block schematic diagram showing a memory device 900 according to another embodiment. Memory device 900 includes memory cells divided into different groups that share a same adaptive read circuit, where a different read threshold value can be generated for each different group.

In the particular embodiment shown, a memory device 900 can include multiple sectors 942-0 to -n, where each sector includes a number of memory cells. In some embodiments, the memory cells of each different sector can be "mass" programmed to a same impedance state. In a very particular embodiment, the memory cells of each sector can be CBRAM cells that are group erasable to a high resistance state.

A reference store 934 can store a reference value (REF_Sector_0 to REF_Sector_n) corresponding to each different sector. Such reference values can control a read threshold value when data values are read from the sector by adaptive read circuit 906. Accordingly, as the memory cells of a given sector progress through a use rotation, the corresponding reference value can be updated accordingly, as described herein, or equivalently.

It is understood that alternate embodiments can include other groupings of memory cells, with each group having its own adaptive read threshold value. As but a few of many possible examples, memory cells can be grouped according to word line, bank, page, rank, etc.

Figure 10:
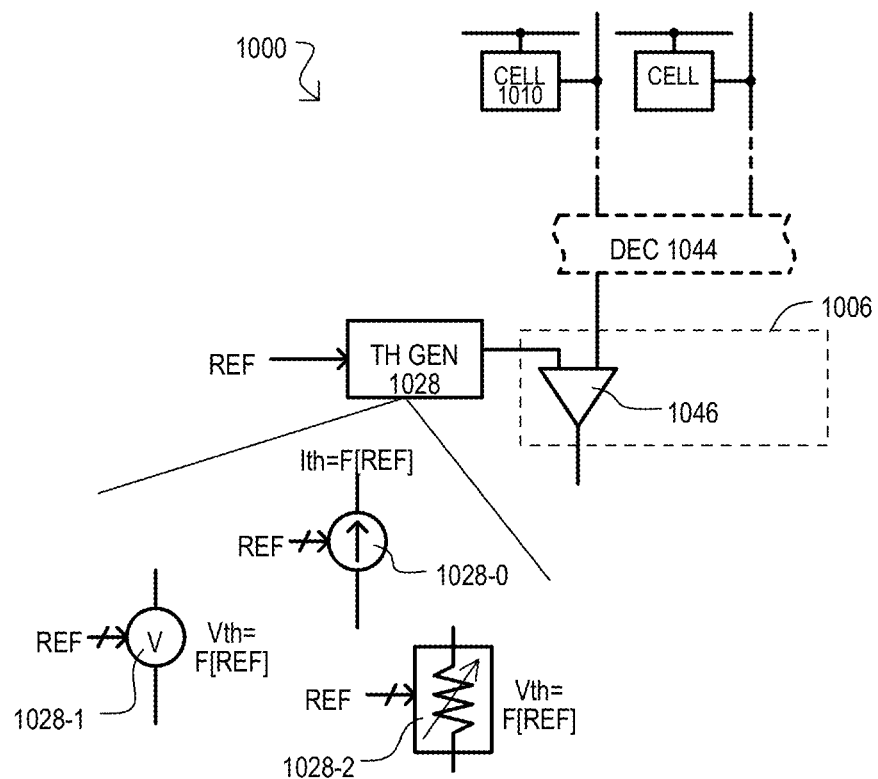
FIG. 10 is a block schematic diagram showing a memory device according to another embodiment.

FIG. 10 shows a memory device 1000 according to another embodiment. Memory device 1000 shows particular examples of adaptive read circuits 1006 that can be included in embodiments.

Referring to FIG. 10, in a read operation, a read path can be created between adaptive read circuit 1006 and the memory cells (one identified as 1010). Optionally, such a read path can include a decoder circuit 1044, which can selectively connect certain memory cells to adaptive read circuits 1006 according to address data.

Adaptive read circuits 1006 can include a number of sense circuits (one shown as 1046). A sense circuit 1046 can be any circuit suitable for comparing a signal generated for a selected memory element with read threshold signal. In particular embodiments, a sense circuit 1046 can include any of: a current comparator that compares a current drawn by a memory cell to a threshold current (Ith) or a voltage comparator that compares a voltage generated from memory cell to a threshold voltage (Vth).

A threshold generator circuit 1028 can include circuits appropriate for the type of sense circuit 1046. A few possible examples are shown in FIG. 10, including: a variable current source 1028-0 that can draw a threshold current Ith, where a magnitude of Ith varies according to a reference value REF; a variable voltage source 1028-1 that can generate a threshold voltage Vth, where a magnitude of Vth varies according to a reference value REF; and a variable resistance circuit 1028-2 that can provide a threshold resistance Rth, where a magnitude of Rth varies according to a reference value REF.

While FIGS. 1-10 have shown devices, circuits and methods according to various embodiments, additional method embodiments will now be described with reference to flow diagrams.

Figure 11:
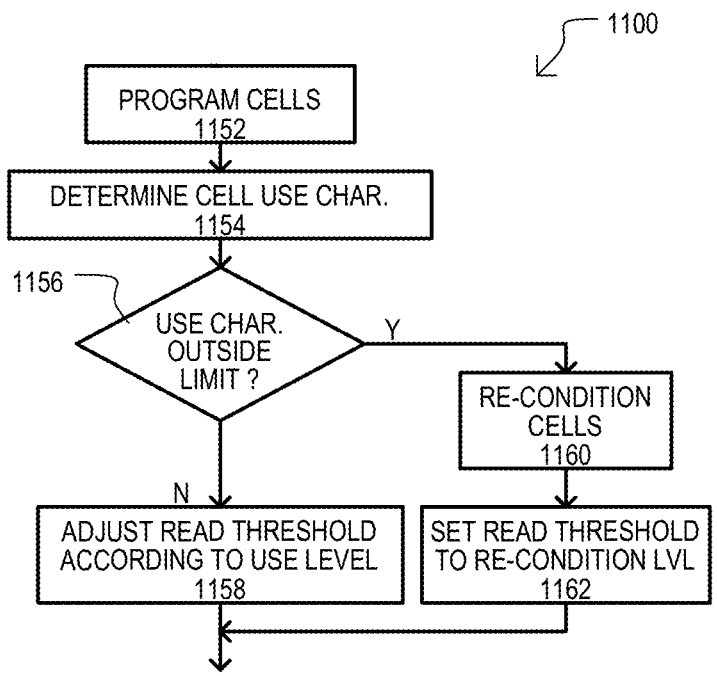
FIG. 11 is a flow diagram showing a method according to an embodiment.

FIG. 11 is flow diagram showing method 1100 according to one embodiment. A method 1100 can include programming memory cells 1152. Such an action can include programming a group of solid electrolyte based memory cells to a same impedance state.

A use characteristic for the cells can be determined 1154. Such an action can include deriving one or more use characteristics according to any of the embodiments herein, or equivalents (e.g., measuring cell performance and/or recording a cell use history, such as number of program cycles).

If a use characteristic (or combination of use characteristics) is not outside of a limit (N from 1156), a read threshold level can be adjusted according to the use characteristic 1158.

However, if a use characteristic is outside of a limit (Y from 1156), the memory cells can be subjected to a re-conditioning 1160. Such an action can tighten an impedance distribution for the cells. In the embodiment shown, following a re-conditioning, a read threshold level can set to a level corresponding to the re-conditioned state (1162). Re-conditioning can include any of the re-conditioning operations described herein, or equivalents.

Figure 12:
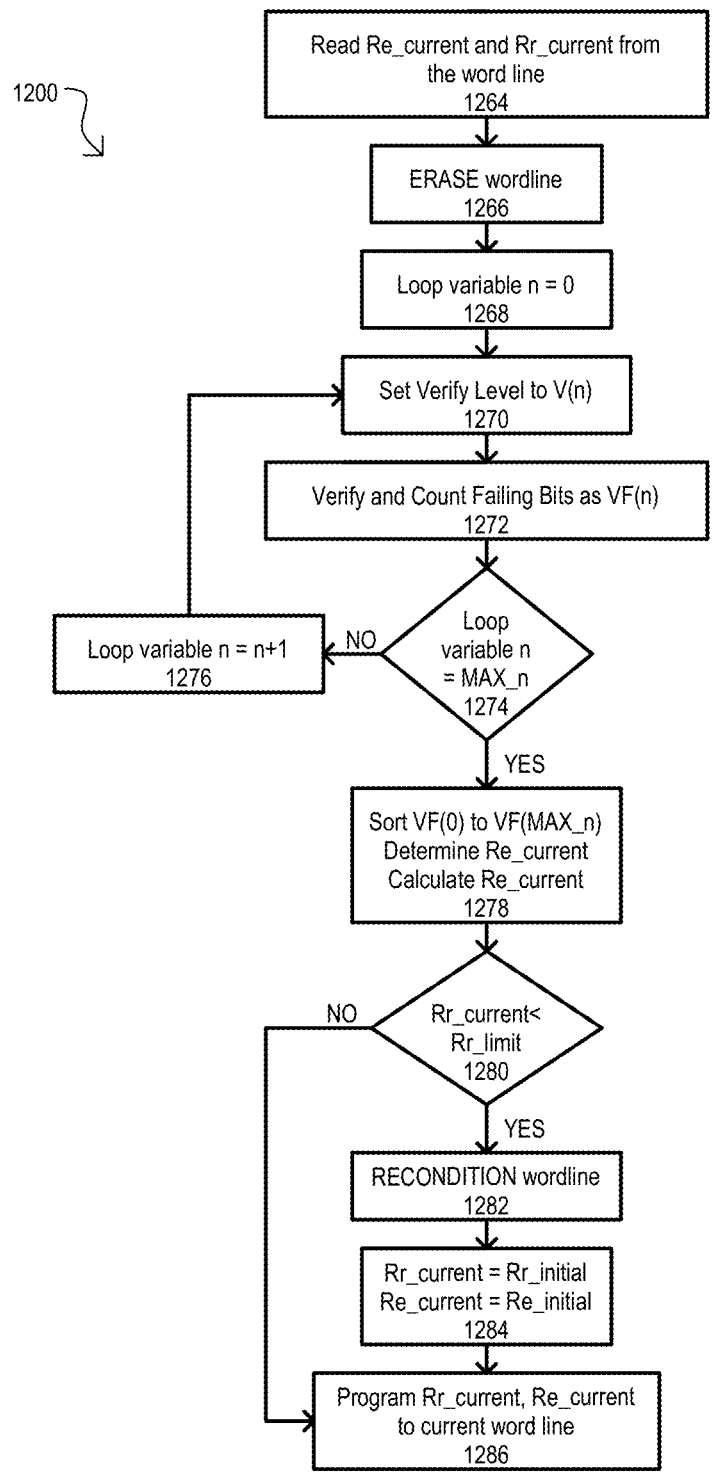
FIG. 12 is a flow diagram showing a method according to another embodiment.

FIG. 12 is a flow diagram showing a method 1200 according to another embodiment. Method 1200 shows a measurement method approach to adjusting read thresholds. In FIG. 1200 it is assumed that a group of memory cells is a word line group, and the memory cells of such a word line group are erased to a high resistance. An erase resistance (Re_current) can correspond to a resistance distribution of erased cells. A read resistance (Rr_current) can be a read threshold value (i.e., if a cell resistance is greater than Rr_current, it is considered erased, and if less than Rr_current it is considered programmed).

A method 1200 can include reading a current erase resistance (Re_current) and a current read resistance (Rr_current, which can be a threshold value) for the memory cells of a word line 1264. The memory cells of the word line can be erased 1266. A verify loop variable can be set to an initial value 1268. A verify level can be set based on the variable loop variable 1272. A verify operation can then be performed on the erased memory cells of the word line, and the number of failing memory cells (bits) for the word line can be stored for that verify level 1272.

A verify loop can continue (1274, 1276, 1270, 1272) until a last verify operation (MAX n) has been performed. Thus, a number failing bits for each verify level can be collected. As noted above, different verify levels can include different conditions.

Once a verify loop is complete (YES from 1274) failure numbers for each verify level can be sorted. From such verify results, a new Re_current value can be determined, and a new Rr_current value can be calculated (1278).

If a calculated read resistance (Rr_current) is less than a limit (YES from 1280), the memory cells of the word line can be subjected to a re-conditioning (1282), and erase and read resistances can be reset to initial values (1284). If a calculated read resistance (Rr_current) is not less than a limit (NO from 1280), the current read resistance and erase resistance can be programmed for the memory cells of the word line (1286).

Figure 13:
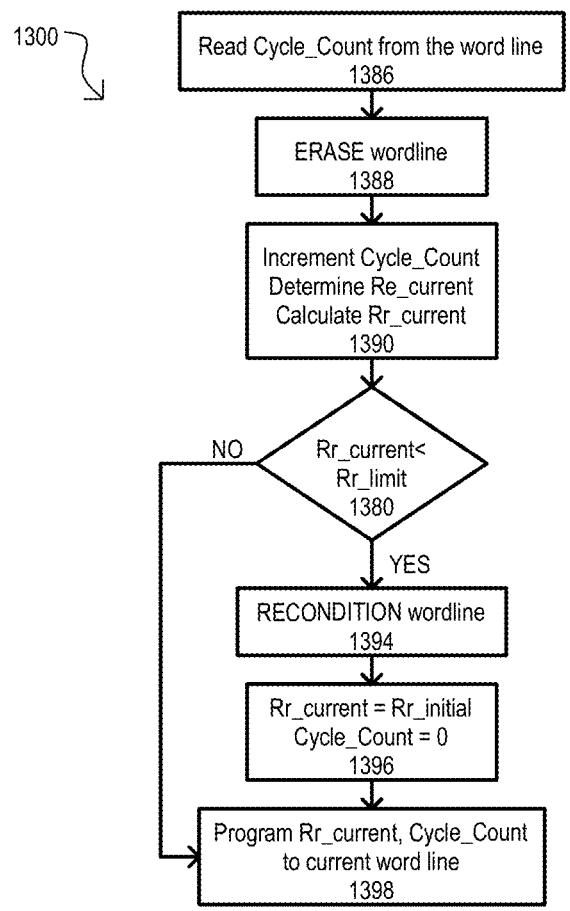
FIG. 13 is a flow diagram showing a method according to another embodiment.

FIG. 13 is a flow diagram showing a method 1300 according to another embodiment. Method 1300 shows a calculation method approach to adjusting read thresholds, according to a particular embodiment. In FIG. 1300 it is assumed that a group of memory cells is a word line group as in the case of FIG. 12.

A method 1300 can include reading a cycle count for memory cells of a word line 1386. The memory cells of the word line can be erased 1388. A cycle count value (Cycle_Count) can be incremented. From such a value, an erase resistance (Re_current) can be determined and a read resistance (Rr_current) can be calculated 1390. In some embodiments, a correspondence between erase cycle number and erase resistance distribution can be based on previous characterization of the memory cells.

If a calculated read resistance (Rr_current) is less than a limit (YES from 1392), the memory cells of the word line can be subjected to a re-conditioning (1394). A read resistance can be reset to an initial value, and cycle count can be reset (1394). If a calculated read resistance (Rr_current) is not less than a limit (NO from 1392), the current read resistance and cycle count can be programmed for the memory cells of the word line (1398).

Figure 14A:
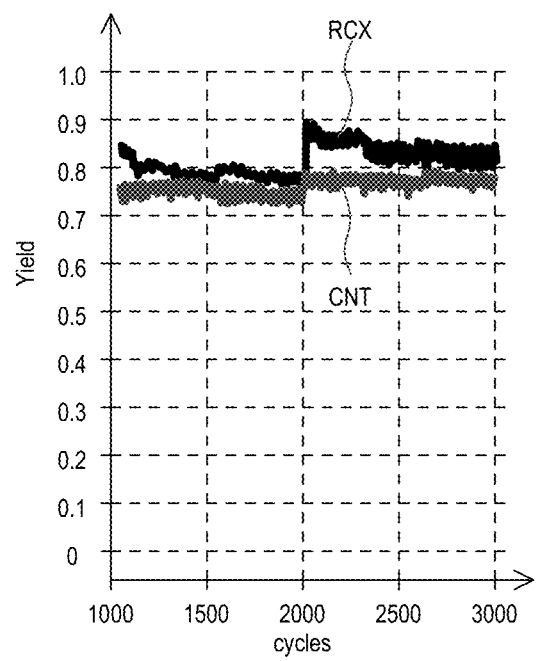
FIGS. 14A and 14B are graphs showing experimental results for memory devices according to particular embodiments.
Figure 14B:
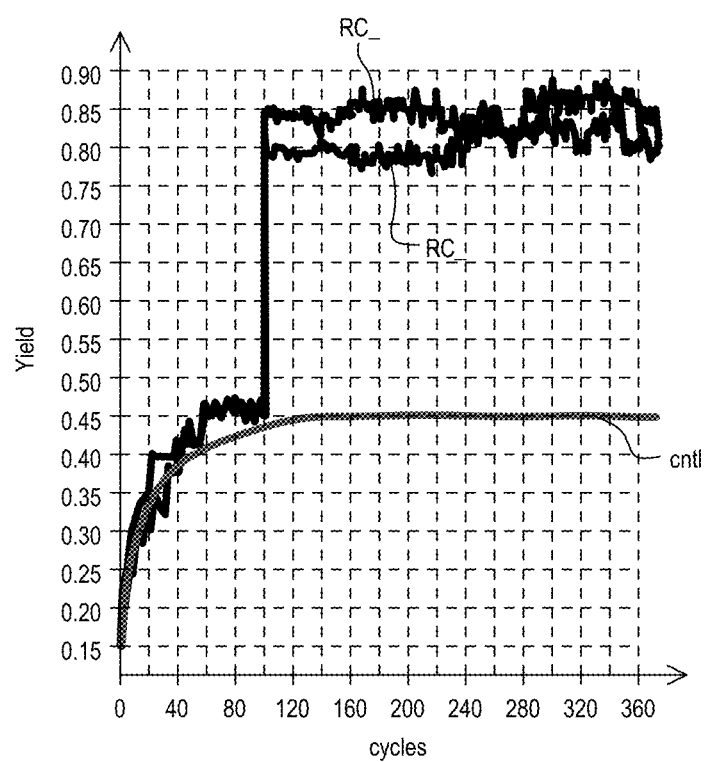
Figures 15A, 15B, 15C, 15D:
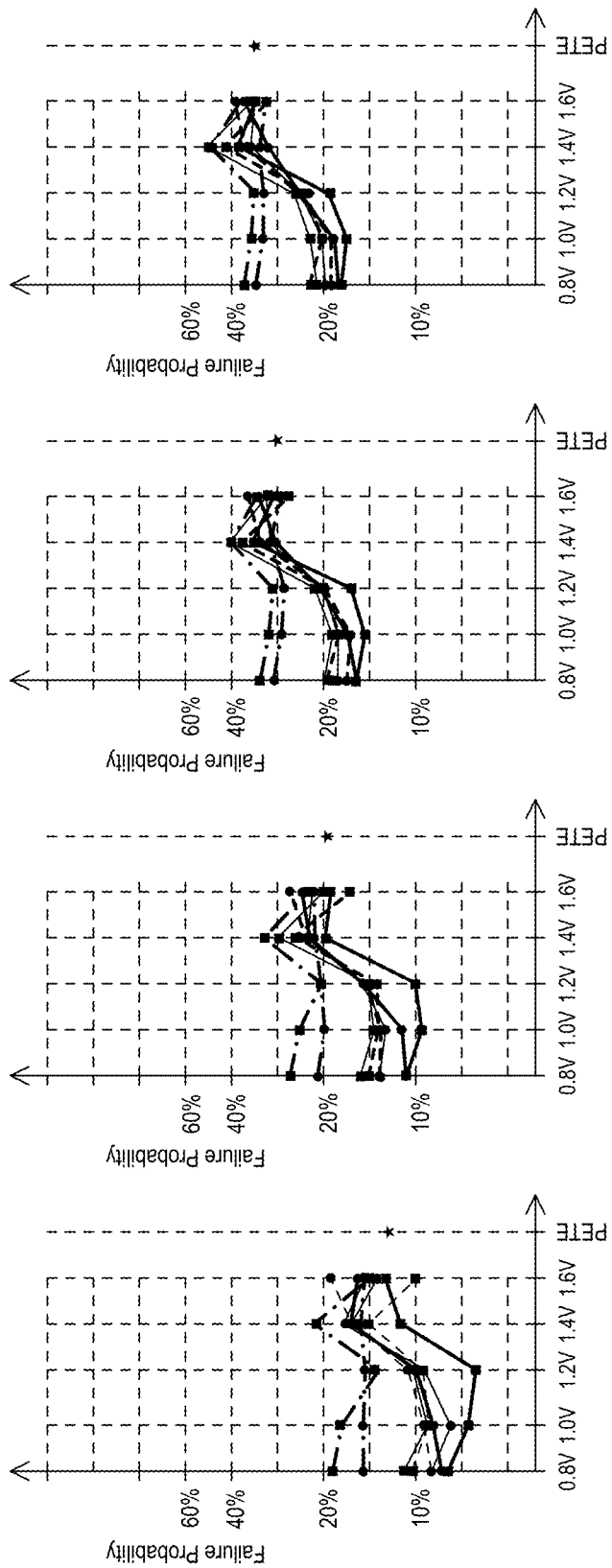
FIGS. 15A to 15D are graphs showing failure probabilities for various read points of a memory device according to an embodiment

FIGS. 14A and 14B are graphs illustrating experimental results for memory devices according to particular embodiments. FIGS. 14A and 14B show yields of devices over a number of cycles. In FIG. 14A, devices experiencing re-conditioning are shown as RCX, while a control group that does not have reconditioning is shown as CNT. In FIG. 14B, devices experiencing reconditioning are shown as RC_, while a control group that does not have reconditioning is shown as cntl.

FIGS. 15A to 15D shows graphs of failure probability for various read points of a memory device according to an embodiment. Values for C400E correspond to memory devices given an erase type preconditioning at various pulse widths (ER_PW). Values for RCER4 correspond to memory devices given an erase type preconditioning, and then erase type re-conditioning every 100 cycles, at various pulse widths (ER_PW). The points for CNT01 show a control group (a group that does not receive re-conditioning).

Figures 16A, 16B, 16C:
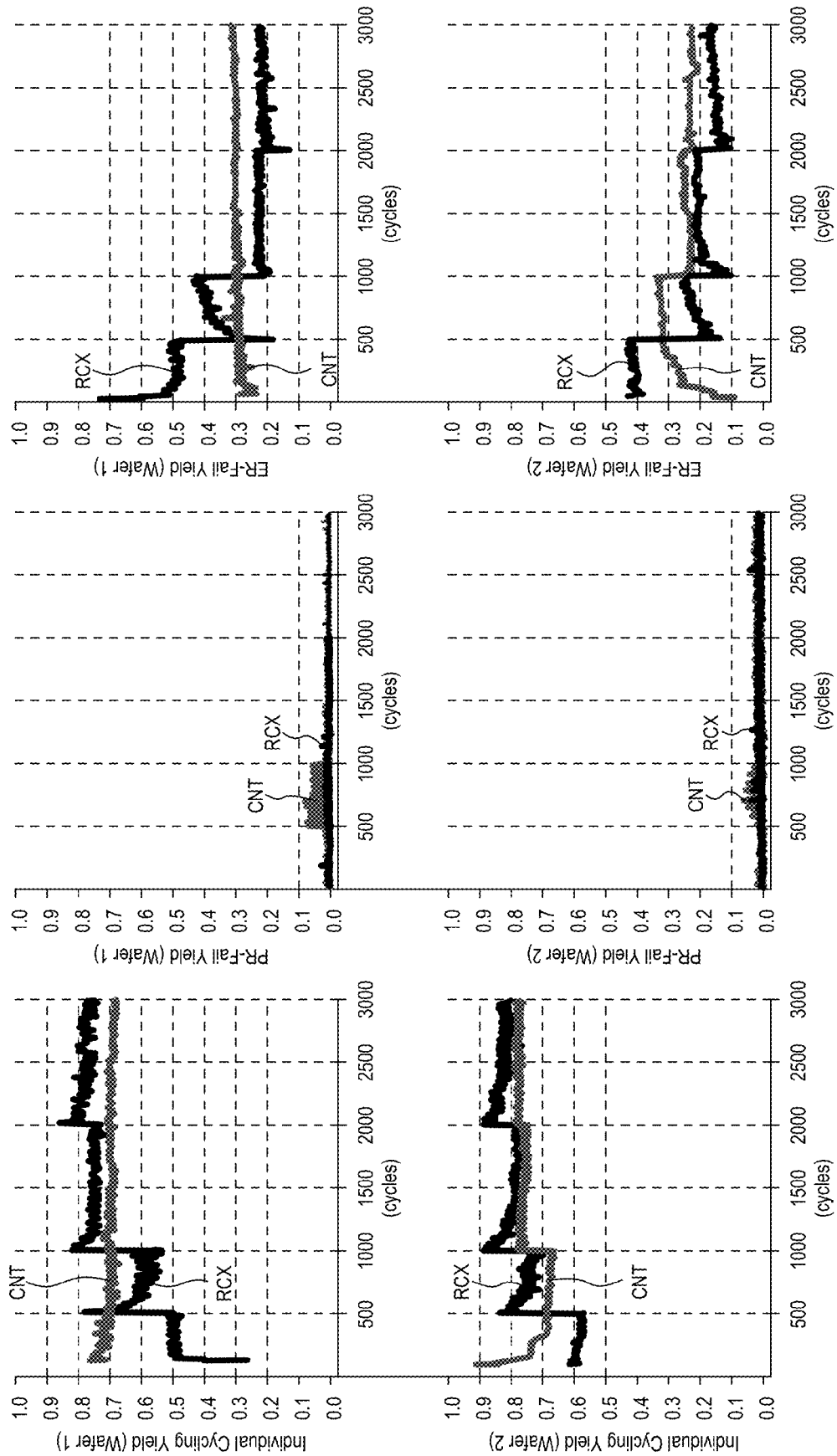
FIGS. 16A to 16C show various yield comparisons between memory devices having re-conditioning and a control memory device.

FIGS. 16A to 16C show various yield comparisons between memory devices having re-conditioning at 500, 1000 and 2000 cycles (RCX) and a control memory device (CNT). FIG. 16A is a graph for individual cycle yields (shown as "Individual Cycling Yield"). FIG. 16B is a graph showing program yields (i.e., program failures, shown as "PR-Fail Yield per cycle"). FIG. 16C is a graph showing erase yields (i.e., erase failures, shown as "ER-Fail Yield per cycle").

It is understood that the results shown in FIGS. 14A to 16C are but experimental results, and other embodiments may have different result, including better results, with variations in materials, dimensions, or fabrication process.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
 programming memory cells to one of least two different impedance levels to establish data values stored therein;

after the memory cells have been programmed to their impedance levels, determining at least one use characteristic for the memory cells comprising a solid electrolyte, the use characteristic varying according to a number of times the memory cells have been programmed to at least one of the impedance levels; and adjusting a read threshold level for the memory cells based on at least the use characteristic exceeding a predetermined limit, the read threshold level determining data values stored in the memory cells in a read operation, the read threshold level distinguishing between the at least two different impedance states.

2. The method of claim 1, further including:
the memory cells comprise conductive bridging random access memory (CBRAM) type cells programmable between at least two different resistance states; and
programming the memory cells includes erasing the memory cells to a high resistance state and programming the memory cells to a low resistance state.

3. The method of claim 1, wherein:
the memory cells comprise a solid electrolyte selected from the group of: a metal oxide, a non-metal oxide, a chalcogenide, a transition metal oxide, and a rare-earth oxide.

4. The method of claim 1, wherein:
determining at least one use characteristic includes determining a range of impedances of all the memory cells of a predetermined group of memory cells.

5. The method of claim 4, wherein:
determining the range of impedances of all the memory cells of the predetermined group includes
applying program conditions to the memory cells,
repeatedly verifying whether any memory cells were not programmed; and
at least one use characteristic is based on the number of times program conditions were applied to the predetermined group of memory cells.

6. The method of claim 1, further including:
incrementing a cycle count for the memory cells in response to the memory cells being programmed; and
determining the use characteristic includes reading the cycle count for the memory cells.

7. The method of claim 1, wherein:
the read threshold level is selected from the group of: a read reference current compared to a memory cell current in a read operation; a read threshold voltage compared to a voltage generated with a memory cell in a read operation; and a read resistance compared to a memory cell resistance in a read operation.

8. The method of claim 1, further including:
re-conditioning the memory cells if at least one use characteristic is outside of at least one limit, the re-conditioning including the application of electrical conditions different than those that program the memory cells to particular impedance levels prior to the re-conditioning.

9. The method of claim 8, wherein:
the re-conditioning changes the memory cells to have a tighter impedance distribution than that prior to the re-conditioning.

10. The method of claim 1, further including:
programming one of a plurality of sections in a memory device;
determining at least one use characteristic for the memory cells includes determining the use characteristic for the programmed section; and
adjusting a read threshold level includes adjusting a read threshold level for the section; wherein
each section has its own use characteristic and read threshold level.

11. A memory device, comprising:
a plurality of solid electrolyte memory cells programmable between at least two impedance levels;
a controller circuit configured to generate and store at least one use characteristic that varies according to a number of times the memory cells have been programmed; and
a read circuit configured to generate read data by comparing sense values generated from the memory cells to at least one threshold value, the at least one threshold value varying in response to at least one use characteristic exceeding a predetermined limit.

12. The memory device of claim 11, wherein:
the memory cells comprise conductive bridging random access memory (CBRAM) type cells programmable between at least two different resistance states.

13. The method of claim 11, wherein:
the memory cells comprise a solid electrolyte selected from the group of: a metal oxide, a non-metal oxide, a chalcogenide, a transition metal oxide, and a rare-earth oxide.

14. The memory device of claim 11, wherein:
the memory cells are arranged into a plurality of sections; and
the read circuit compares sense values of memory cells from one section to a threshold value particular to that section.

15. The memory device of claim 14, wherein:
the sections comprise sectors, the memory cells of each sector being programmable to one value in a single operation.

16. A memory device, comprising:
a plurality of solid electrolyte memory cells programmable between at least two impedance levels;
a programming circuit that applies programming electrical conditions to the memory elements to store data values therein;
a controller circuit configured to generate and store at least one use characteristic that changes according to a number of times the memory cells have been programmed to at least one impedance state; and
a re-conditioning circuit that, when activated, applies re-conditioning electrical conditions to the memory cells that are different from programming electrical conditions; wherein
the controller circuit is further configured to activate the re-conditioning circuit in response to the use characteristic being outside of at least one limit.

17. The method of claim 16, wherein:
the re-conditioning electrical conditions change the memory cells to have a tighter impedance distribution than that prior to the application of the re-conditioning electrical conditions.

18. The memory device of claim 16, further including:
a read circuit configured to generate read data by comparing sense values generated from the memory cells to at least one threshold value, the at least one threshold value varying in response to at least one use characteristic.

19. The memory device of claim 16, further including:
a program and verify circuit configured to apply programming electrical conditions to the memory elements to store particular data values therein, and to generate verify results indicating if any of the memory elements stores an incorrect data value; and the controller circuit includes a verify loop circuit configured to selectively change verify electrical conditions in response to the verify results; wherein
the use characteristic include the verify results.

20. The memory device of claim 16, wherein:
the controller circuit includes a cycle counter circuit that increments a count value for the memory cells in response to the programming circuit applying at least one programming electrical condition to the memory elements; wherein
the use characteristic includes the count value.

\* \* \* \* \*